(12) United States Patent
Ando et al.

(10) Patent No.: US 11,616,194 B2
(45) Date of Patent: Mar. 28, 2023

(54) ETCHING METHOD

(71) Applicant: TOKYO ELECTRON LIMITED, Tokyo (JP)

(72) Inventors: Ken Ando, Tokyo (JP); Hiroki Maehara, Tokyo (JP); Jun Sato, Miyagi (JP); Kiyoshi Maeda, Miyagi (JP); Shigeru Tahara, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 155 days.

(21) Appl. No.: 17/040,483

(22) PCT Filed: Mar. 15, 2019

(86) PCT No.: PCT/JP2019/010969
§ 371 (c)(1),
(2) Date: Sep. 22, 2020

(87) PCT Pub. No.: WO2019/188450
PCT Pub. Date: Oct. 3, 2019

(65) Prior Publication Data
US 2021/0028356 A1   Jan. 28, 2021

(30) Foreign Application Priority Data
Mar. 29, 2018 (JP) .............................. JP2018-063934

(51) Int. Cl.
*H01L 43/08* (2006.01)
*H01L 43/12* (2006.01)

(52) U.S. Cl.
CPC .............. *H01L 43/12* (2013.01); *H01L 43/08* (2013.01)

(58) Field of Classification Search
CPC ................................ H01L 43/08; H01L 43/12
USPC .............................................................. 438/3
See application file for complete search history.

(56) References Cited

U.S. PATENT DOCUMENTS

| | | | | |
|---|---|---|---|---|
| 8,970,213 B2* | 3/2015 | Toyosato | ................ | H01L 43/12 324/245 |
| 2009/0163033 A1* | 6/2009 | Ding | ................. | H01J 37/32522 438/716 |
| 2010/0044340 A1* | 2/2010 | Kodaira | ................. | B82Y 25/00 216/22 |
| 2011/0272770 A1* | 11/2011 | Hatada | .................... | H01L 43/12 257/E29.323 |
| 2011/0306215 A1* | 12/2011 | Ding | ................. | H01L 21/02057 438/720 |
| 2013/0087174 A1* | 4/2013 | Sun | ................... | H01J 37/32449 134/30 |
| 2020/0194277 A1* | 6/2020 | Dai | ................... | H01L 21/31116 |

FOREIGN PATENT DOCUMENTS

| | | |
|---|---|---|
| JP | 2011-14881 A | 1/2011 |
| WO | 2012/176747 A | 12/2012 |

* cited by examiner

*Primary Examiner* — Jami Valentine Miller
(74) *Attorney, Agent, or Firm* — Nath, Goldberg & Meyer; Jerald L. Meyer; Tanya E. Harkins

(57) ABSTRACT

An etching method includes: preparing a workpiece including a metal multilayer film having a magnetic tunnel junction and a mask formed by an inorganic material on the metal multilayer film; and etching the metal multilayer film by plasma of a mixed gas of ethylene gas and oxygen gas using the mask.

8 Claims, 7 Drawing Sheets

FIG. 8

| $C_2H_4/O_2$ flow rate | 50 sccm /0 sccm | 50 sccm /30 sccm | 50 sccm /50 sccm | 50 sccm /60 sccm |
|---|---|---|---|---|
| Etching | × | ○ | ○ | △ |

ETCHING METHOD

TECHNICAL FIELD

The present disclosure relates to an etching method.

BACKGROUND

Patent Document 1 discloses a kind of substrate processing method. In this substrate processing method, an MTJ element including a magnetic tunnel junction (MTJ), in which an insulating layer is sandwiched between a lower magnetic layer and an upper magnetic layer, is etched. The MTJ element is etched by methanol gas plasma using a mask of a non-organic material such as Ta or Ti.

PRIOR ART DOCUMENT

Patent Document

Patent Document 1: Japanese laid-open Publication No. 2011-14881

When a methanol gas is used as an etching gas for an MTJ element, plasma of the methanol gas may cause damage to a metal multilayer film including a magnetic tunnel junction, thereby deteriorating electromagnetic characteristics. The present disclosure provides some embodiments of a technique capable of suppressing deterioration of electromagnetic characteristics of a metal multilayer film when etching the metal multilayer film including a magnetic tunnel junction.

SUMMARY

According to one embodiment of the present disclosure, an etching method includes: preparing a workpiece including a metal multilayer film having a magnetic tunnel junction and a mask formed by an inorganic material on the metal multilayer film; and etching the metal multilayer film by plasma of a mixed gas of ethylene gas and oxygen gas using the mask.

Ions and/or radicals of hydrogen and oxygen contained in methanol plasma affect the plasma etching of the metal multilayer film including the magnetic tunnel junction. For example, when the metal multilayer film is etched by plasma of the hydrogen gas, the electromagnetic characteristics of the metal multilayer film are deteriorated. Presumably, the reason for this deterioration is that ions and/or radicals of hydrogen modify the metal multilayer film. Further, when an etching gas does not contain oxygen, a selection ratio between a metal multilayer film and a mask formed of a non-organic material is not sufficiently obtained. In the etching method according to one aspect, the etching gas is a mixed gas of ethylene gas and oxygen gas. The ethylene gas has a lower hydrogen content than a methanol gas. Therefore, in the etching method according to one aspect, it is possible to suppress deterioration of electromagnetic characteristics of the metal multilayer film including the magnetic tunnel junction, as compared with a case where methanol is used as the etching gas. Moreover, in the etching method according to one aspect, the etching gas contains oxygen. Therefore, it is possible to obtain a sufficient selection ratio between the metal multilayer film and the mask formed of a non-organic material.

In one embodiment, the ethylene gas may be included in the mixed gas in a ratio of 50% to 63% with respect to the total amount of the ethylene gas and the oxygen gas.

According to this etching method, the metal multilayer film including the magnetic tunnel junction can be etched without generating an etching stop.

As described above, it is possible to provide an etching method capable of suppressing deterioration of electromagnetic characteristics of a metal multilayer film including a magnetic tunnel junction.

BRIEF DESCRIPTION OF DRAWINGS

FIG. 8 is a table showing a relationship between a flow rate ratio of ethylene and oxygen and an etching feasibility.

DETAILED DESCRIPTION

Figure 1:
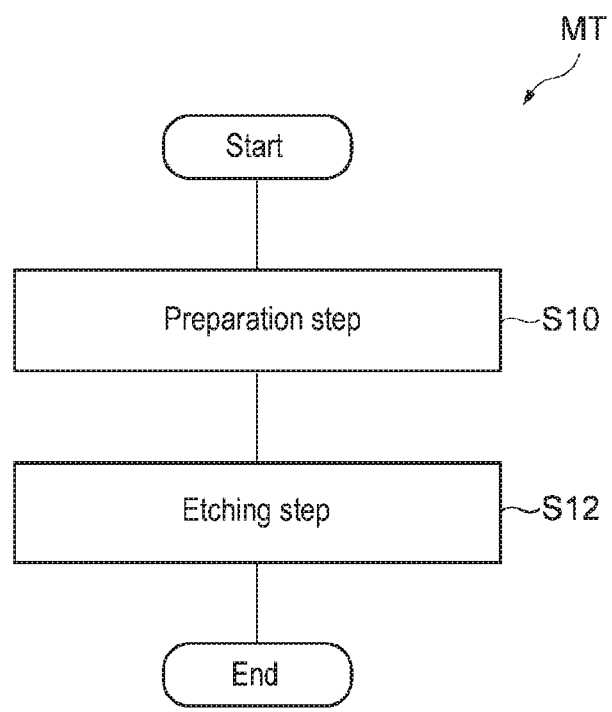
FIG. 1 is a flowchart showing an etching method according to one embodiment.

Hereinafter, various embodiments will be described in detail with reference to the drawings. In each drawing, the same or corresponding parts are designated by like reference numerals.

FIG. 1 is a flowchart showing an etching method according to one embodiment. The etching method shown in FIG. 1, namely the method MT, is performed to etch a metal multilayer film including a magnetic tunnel junction. The magnetic tunnel junction refers to a stacked structure in which an extremely thin insulating layer that allows a tunnel current to flow therethrough when a voltage is applied thereto is sandwiched between a lower magnetic layer and an upper magnetic layer. The metal multilayer film is a stacked structure including a plurality of layers formed of a metallic magnetic material.

Figure 2:
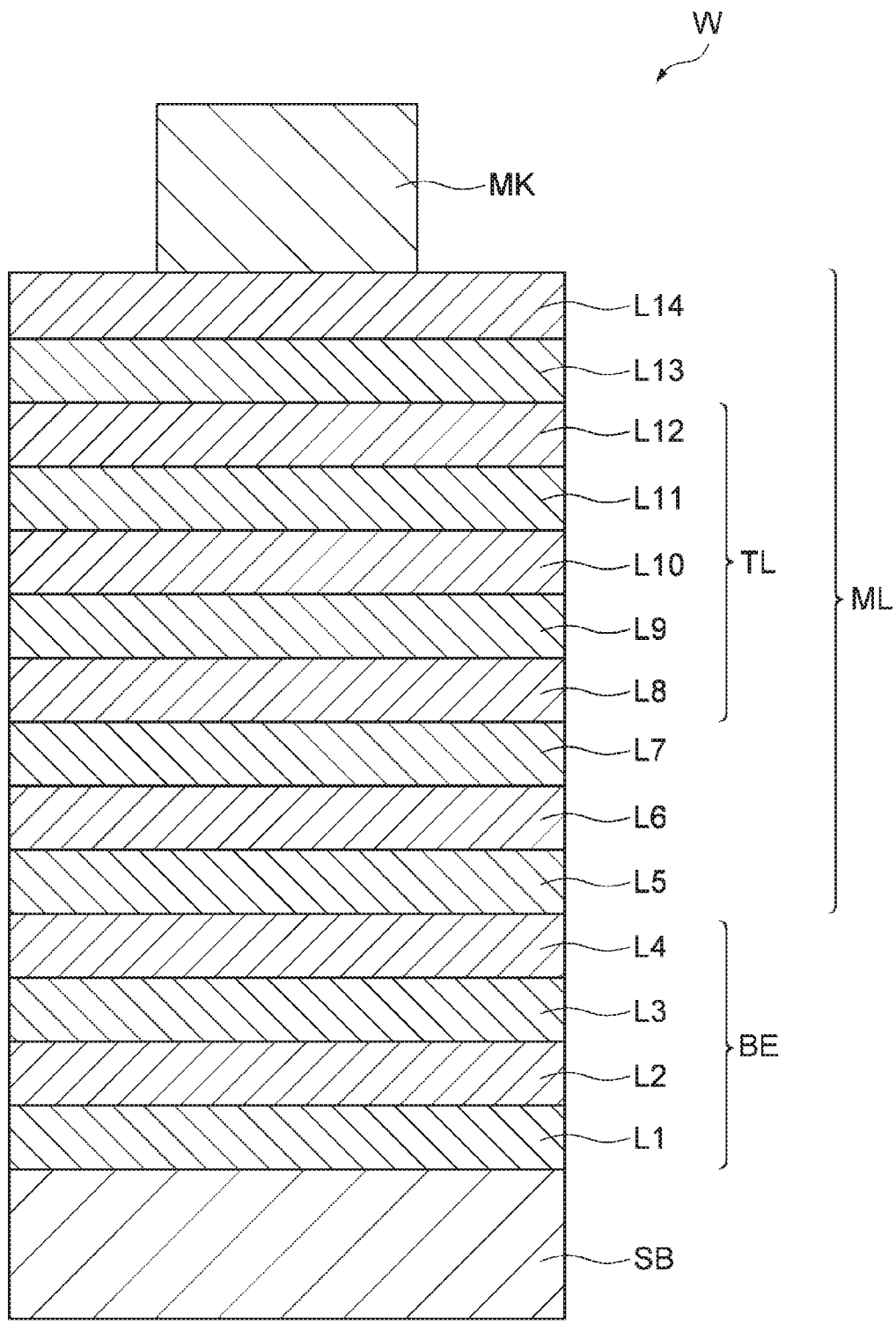
FIG. 2 is a cross-sectional view of an example of a workpiece to which the etching method shown in FIG. 1 may be applied.

FIG. 2 is a cross-sectional view of an example of a workpiece to which the etching method shown in FIG. 1 may be applied. The workpiece shown in FIG. 2, i.e., a wafer W, includes a substrate SB, a lower electrode layer BE, a metal multilayer film ML, and a mask MK. The wafer W is obtained, for example, in a process of manufacturing an MRAM (Magnetic Random Access Memory) element, which is one type of MTJ element.

The lower electrode layer BE is a film having electrical conductivity and is a lower electrode of the MRAM element. The lower electrode layer BE is formed on the substrate SB. The lower electrode layer BE is made of, for example, a metallic material. An example of the metallic material is Ta or Ru. The lower electrode layer BE may include a plurality of layers. The lower electrode layer BE includes, for example, a first layer L1, a second layer L2, a third layer L3, and a fourth layer L4. The first layer L1 is a lowermost layer, i.e., a layer provided closest to the substrate SB, and is made of Ta. The second layer L2 is provided on the first layer L1 and is made of Ru. The third layer L3 is provided on the second layer L2 and is made of Ta. The fourth layer L4 is provided on the third layer L3 and is made of Ru. The upper layer of the lower electrode layer BE, for example, the third layer L3 and the fourth layer L4, may be formed as a seed layer for growing a film on the upper layer.

The metal multilayer film ML is formed on the lower electrode layer BE. The metal multilayer film ML has a plurality of layers and includes a layer made of a metallic magnetic material. As an example, the metal multilayer film ML has ten layers including a fifth layer L5 to a fourteenth layer L14. Each of the fifth layer L5 to the fourteenth layer L14 is a layer made of metal. The fifth layer L5 is a layer provided closest to the lower electrode layer BE and is made of Pt. The sixth layer L6 is provided on the fifth layer L5 and is made of Pt and Co. The seventh layer L7 is provided on the sixth layer L6 and is made of Ru. The eighth layer L8 is provided on the seventh layer L7 and is made of CoFeB. The ninth layer L9 is provided on the eighth layer L8 and is made of MgO. The tenth layer L10 is provided on the ninth layer L9 and is made of CoFeB. The eleventh layer L11 is provided on the tenth layer L 10 and is made of MgO. The twelfth layer L12 is provided on the eleventh layer L11 and is made of CoFeB. The thirteenth layer L13 is provided on the twelfth layer L12 and is made of Ta. The fourteenth 14th is provided on the thirteenth layer L13 and is made of Ru.

The fifth layer L5 of the metal multilayer film ML is a seed layer for growing a film thereon. The sixth layer L6 has a structure in which Pt thin films and Co thin films are alternately stacked. The sixth layer L6 is an antiferromagnetic layer. The seventh layer L7 is a spacer layer between the antiferromagnetic layer and an upper magnetization fixed layer. The eighth layer L8 to the twelfth layer L12 are an MTJ multilayer film TL that forms a magnetic tunnel junction. The eighth layer L8, the ninth layer L9, and the tenth layer L10 form a magnetization fixed layer. The eleventh layer L11 is a tunnel barrier layer. The twelfth layer L12 is a magnetization free layer. The thirteenth layer L13 and the fourteenth layer L14 form an upper electrode. The twelfth layer L12 may have a stacked structure formed of a plurality of magnetic layers and nonmagnetic layers in order to obtain desired characteristics.

Hereinafter, the thickness of each layer will be exemplified. The thickness of the first layer L1 is 3 nm, the thickness of the second layer L2 is 50 nm, the thickness of the third layer L3 is 3 nm, the thickness of the fourth layer L4 is 50 nm, and the thickness of the metal multilayer film ML is 15 nm.

7 The mask MK is provided on the metal multilayer film ML. The mask MK is made of a non-organic material. The non-organic material is, for example, tantalum (Ta), titanium (Ti), tungsten (W), or an oxide, a nitride, or a carbide thereof. The mask MK may be formed of a multilayer film. A pattern of the mask MK may be formed by plasma etching.

The configuration and material of the wafer W shown in FIG. 2 and the thickness of each layer described above are examples. The application target of the method MT is not limited to the wafer W shown in FIG. 2.

Figure 3:
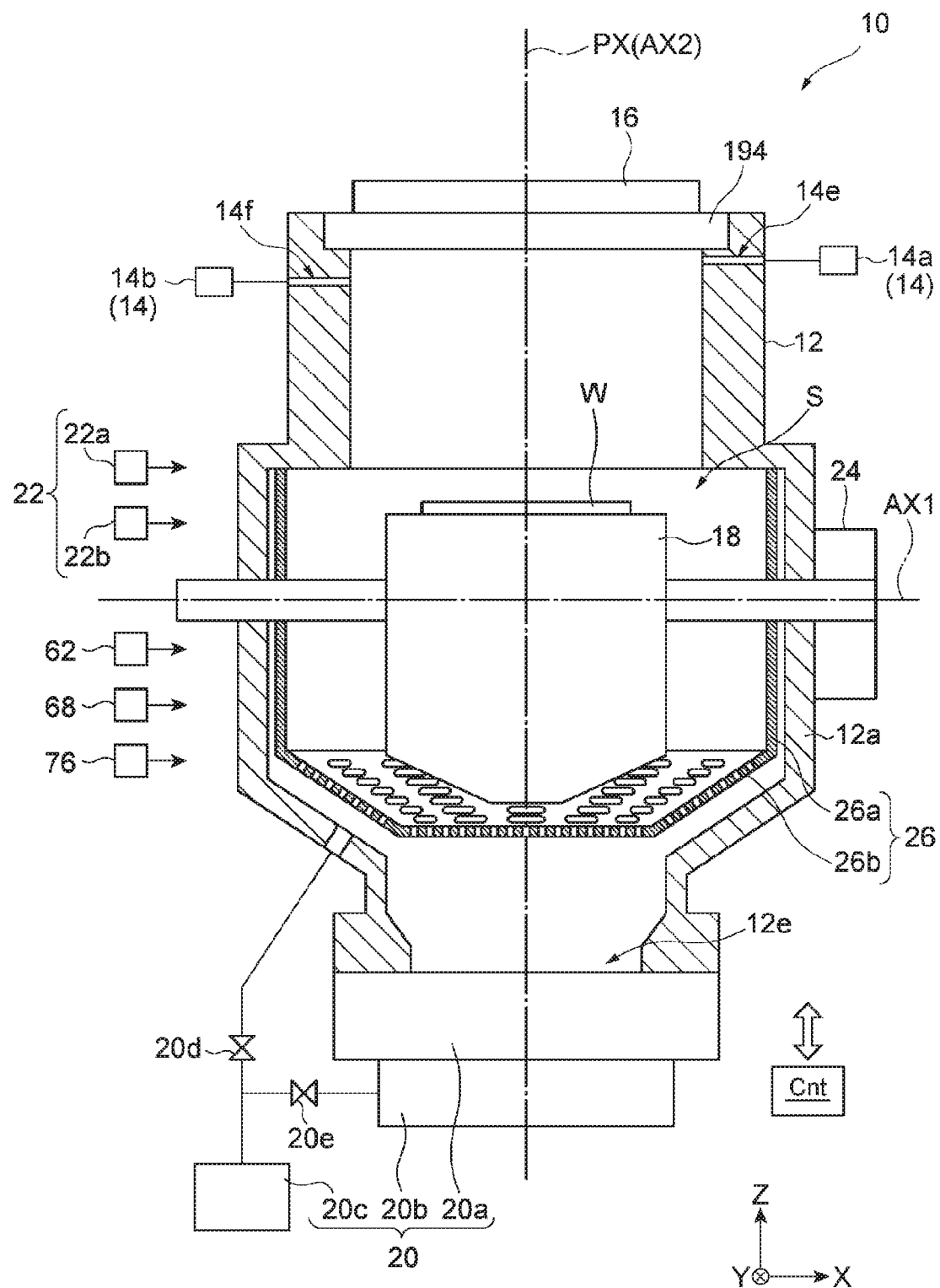
FIG. 3 is a diagram illustrating a plasma processing apparatus that may be used to perform the etching method shown in FIG. 1.

A plasma processing apparatus is used to perform the method MT. FIG. 3 is a diagram schematically showing an example of the plasma processing apparatus that may be used for performing the method MT. In FIG. 3, the plasma processing apparatus is shown by cutting a processing container along one plane including an axis line PX extending in a vertical direction.

The plasma processing apparatus 10 shown in FIG. 3 includes a processing container 12, a gas supply system 14, a plasma source 16, a support structure 18, an exhaust system 20, a bias power supply part 22, and a controller Cnt. The processing container 12 has a substantially cylindrical shape. In one embodiment, the central axis of the processing container 12 coincides with the axis line PX. The processing container 12 provides a space S in which plasma processing is performed on the wafer W.

In one embodiment, the processing container 12 has a substantially constant width in an intermediate portion 12a in a height direction thereof, i.e., a portion that accommodates the support structure 18. The processing container 12 has a tapered shape in which the width gradually narrows from the lower end of the intermediate portion toward the bottom. The bottom of the processing container 12 provides an exhaust port 12e. The exhaust port 12e is formed symmetrically with respect to the axis line PX.

The gas supply system 14 is configured to supply gases into the processing container 12. The gas supply system 14 includes a first gas supply part 14a and a second gas supply part 14b. The first gas supply part 14a is configured to supply a first processing gas into the processing container 12. The second gas supply part 14b is configured to supply a second processing gas into the processing container 12.

The first gas supply part 14a supplies the first processing gas into the processing container 12 via one or more gas discharge holes 14e. In addition, the second gas supply part 14b supplies the second processing gas into the processing container 12 via one or more gas discharge holes 14f. The gas discharge holes 14e are provided closer to the plasma source 16 than the gas discharge holes 14f. Therefore, the first processing gas is supplied to a position closer to the plasma source 16 than the second processing gas. In FIG. 3, the number of each of the gas discharge holes 14e and the gas discharge holes 14f is "1". However, a plurality of gas discharge holes 14e and a plurality of gas discharge holes 14f may be provided. The plurality of gas discharge holes 14e may be evenly arranged in the circumferential direction with respect to the axis line PX. The plurality of gas discharge holes 14f may also be evenly arranged in the circumferential direction with respect to the axis line PX.

The first gas supply part 14a may include one or more gas sources, one or more flow rate controllers, and one or more valves. Therefore, a flow rate of the first processing gas supplied from one or more gas sources of the first gas supply part 14a can be adjusted. The one or more gas sources of the first gas supply part 14a may include a source of ethylene gas and a source of oxygen gas. The ethylene gas is a gas containing ethylene ($C_2H_4$). The oxygen gas is a gas containing oxygen ($O_2$). The first processing gas may be a mixed gas of the ethylene gas and the oxygen gas. For example, the ethylene gas is mixed in a ratio of 50% to 63% with respect to the total amount of the ethylene gas and the oxygen gas. The one or more gas sources of the first gas supply part 14a may include a source of noble gas. Any noble gas such as an argon gas or a helium gas may be used as the noble gas.

In addition, the second gas supply part 14b may include one or more gas sources, one or more flow rate controllers, and one or more valves. Therefore, a flow rate of the second processing gas supplied from one or more gas sources of the second gas supply part 14b can be adjusted. One or more gas sources of the second gas supply part 14b may include a source of noble gas.

The flow rate and supply timing of the first processing gas supplied from the first gas supply part 14a, and the flow rate and supply timing of the second processing gas supplied from the second gas supply part 14b are separately adjusted by the controller Cnt. The second gas supply part 14b may be omitted. In this case, the controller Cnt only needs to adjust the supply timing of the first processing gas.

The plasma source 16 is configured to excite the gas supplied into the processing container 12. In one embodiment, the plasma source 16 is provided at the top of the processing container 12. In one embodiment, the central axis of the plasma source 16 coincides with the axis line PX.

Figure 4:
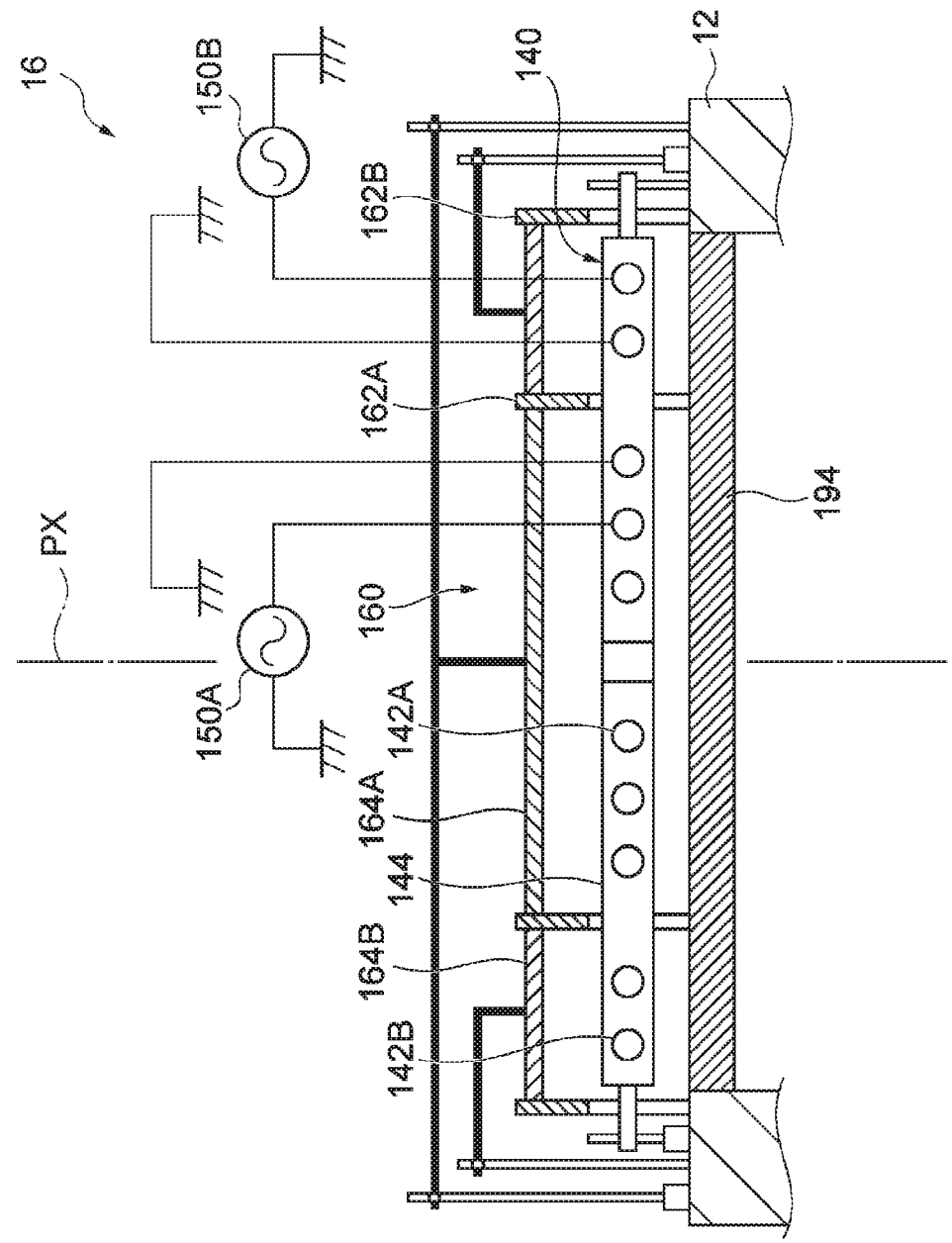
FIG. 4 is a diagram showing a plasma source of one embodiment.
Figure 5:
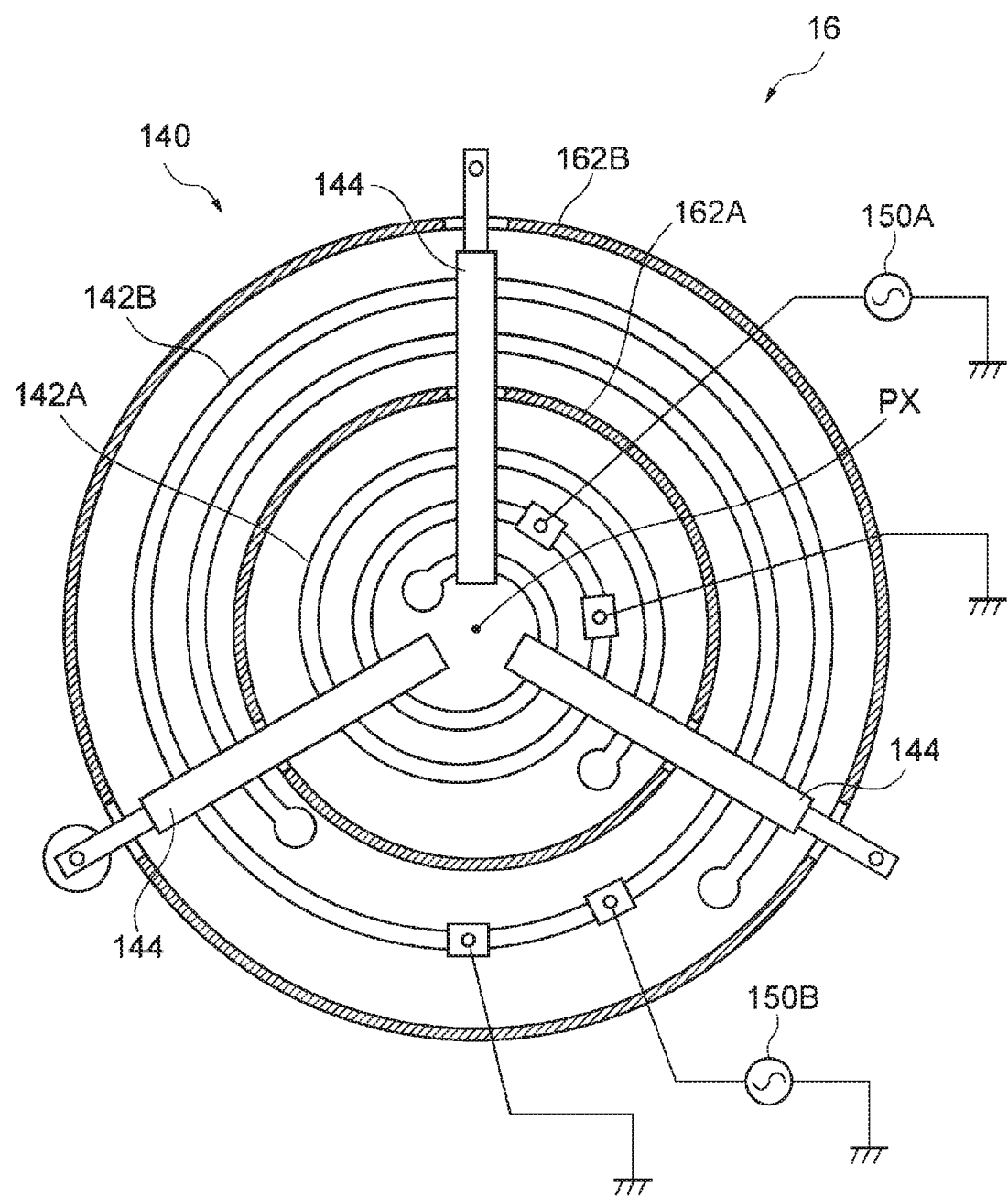
FIG. 5 is a diagram showing the plasma source of one embodiment.

FIG. 4 is a diagram showing the plasma source according to one embodiment, and is a diagram showing the plasma source viewed from the Y direction in FIG. 3. FIG. 5 is a diagram showing the plasma source according to one embodiment, and is a diagram showing the plasma source viewed from the vertical direction. As shown in FIGS. 3 and 4, an opening is provided at the top of the processing container 12. The opening is closed by a dielectric plate 194. The dielectric plate 194 is a plate-shaped body, and is made of quartz glass or ceramic. The plasma source 16 is provided on the dielectric plate 194.

More specifically, as shown in FIGS. 4 and 5, the plasma source 16 includes a high-frequency antenna 140 and a shield member 160. The high-frequency antenna 140 is covered by the shield member 160. In one embodiment, the high-frequency antenna 140 includes an inner antenna element 142A and an outer antenna element 142B. The inner antenna element 142A is provided closer to the axis line PX than the outer antenna element 142B. In other words, the outer antenna element 142B is provided outside the inner antenna element 142A so as to surround the inner antenna element 142A. Each of the inner antenna element 142A and the outer antenna element 142B is made of a conductor such as copper, aluminum, or stainless, and extends spirally around the axis line PX.

Both the inner antenna element 142A and the outer antenna element 142B are sandwiched and integrated by a plurality of holding bodies 144. The holding bodies 144 are, for example, rod-shaped members, and are arranged radially with respect to the axis line PX.

The shield member 160 includes an inner shield wall 162A and an outer shield wall 162B. The inner shield wall 162A has a cylindrical shape extending in the vertical direction, and is provided between the inner antenna element 142A and the outer antenna element 142B. The inner shield wall 162A surrounds the inner antenna element 142A. The outer shield wall 162B has a cylindrical shape extending in the vertical direction, and is provided so as to surround the outer antenna element 142B.

An inner shield plate 164A is provided above the inner antenna element 142A. The inner shield plate 164A has a disc shape and is provided so as to close an opening of the inner shield wall 162A. An outer shield plate 164B is provided above the outer antenna element 142B. The outer shield plate 164B is an annular plate and is provided so as to close an opening between the inner shield wall 162A and the outer shield wall 162B.

A high-frequency power source 150A and a high-frequency power source 150B are connected to the inner antenna element 142A and the outer antenna element 142B, respectively. The high-frequency power source 150A and the high-frequency power source 150B are high-frequency power sources for plasma generation. The high-frequency power source 150A and the high-frequency power source 150B are configured to supply high-frequency power having the same frequency or different frequencies to the inner antenna element 142A and the outer antenna element 142B, respectively. For example, the frequency of the high-frequency power outputted from the high-frequency power source 150A and the high-frequency power source 150B may be various frequencies such as 13.56 MHz, 27 MHz, 40 MHz, and 60 MHz.

Returning to FIG. 3, the support structure 18 is configured to hold the wafer W inside the processing container 12. The support structure 18 is configured to be rotatable about a first axis line AX1 orthogonal to the axis line PX. The support structure 18 may be tilted with respect to the axis line PX when rotating around the first axis line AX1. In order to tilt the support structure 18, the plasma processing apparatus 10 includes a driving device 24. The driving device 24 is provided outside the processing container 12 to generate a driving force for rotating the support structure 18 around the first axis line AX1. Furthermore, the support structure 18 is configured to rotate the wafer W about a second axis line AX2 orthogonal to the first axis line AX1. In a state in which the support structure 18 is not tilted, the second axis line AX2 coincides with the axis line PX as shown in FIG. 3. On the other hand, when the support structure 18 remains tilted, the second axis line AX2 is tilted with respect to the axis line PX. An angle formed by the second axis line AX2 and the axis line PX is also referred to as a tilt angle of the support structure 18.

The support structure 18 includes an electrostatic chuck. The electrostatic chuck is connected to a power source 62 (see FIG. 1) via a rotary connector such as a slip ring or the like. A gas line for supplying a heat transfer gas is formed inside the support structure 18. This gas line is connected to a source 68 of heat transfer gas via a rotary joint such as a swivel joint or the like. A coolant flow path is formed inside the support structure 18. The coolant flow path is connected to a chiller unit 76 via a rotary joint such as a swivel joint or the like.

The exhaust system 20 is configured to depressurize an internal pressure of the processing container 12. In one embodiment, the exhaust system 20 includes an automatic pressure controller 20a, a turbo molecular pump 20b, and a dry pump 20c. The turbo molecular pump 20b is provided on the downstream side of the automatic pressure controller 20a. The dry pump 20c is directly connected to the space inside the processing container 12 via a valve 20d. The dry pump 20c is provided on the downstream side of the turbo molecular pump 20b via a valve 20e.

An exhaust system including the automatic pressure controller 20a and the turbo molecular pump 20b is attached to the bottom of the processing container 12. The exhaust system including the automatic pressure controller 20a and the turbo molecular pump 20b is provided directly below the support structure 18. Therefore, in the plasma processing apparatus 10, it is possible to form a uniform exhaust flow from the periphery of the support structure 18 to the exhaust system 20. Thus, it is possible to achieve efficient exhaust. Furthermore, it is possible to uniformly diffuse the plasma generated inside the processing container 12.

In one embodiment, a flow regulating member 26 may be provided inside the processing container 12. The flow regulating member 26 has a substantially tubular shape with a closed lower end. The flow regulating member 26 extends along an inner wall surface of the processing container 12 so as to surround the support structure 18 from the side and the bottom. In an example, the flow regulating member 26 includes an upper portion 26a and a lower portion 26b. The upper portion 26a has a cylindrical shape with a constant width and extends along the inner wall surface of the intermediate portion 12a of the processing container 12. The lower portion 26b is continuous with the upper portion 26a below the upper portion 26a. The lower portion 26b has a tapered shape whose width gradually narrows along the inner wall surface of the processing container 12, and has a flat plate shape at the lower end thereof. A large number of openings (through-holes) are formed in the lower portion 26b. According to the flow regulating member 26, it is possible to generate a pressure difference between the inside of the flow regulating member 26, i.e., the space in which the wafer W is accommodated, and the outside of the flow regulating member 26, i.e., the space on the exhaust side. It is also possible to adjust a residence time of the gas in the space in which the wafer W is accommodated. In addition, it is possible to realize uniform exhaust.

The bias power supply part 22 is configured to selectively apply a bias voltage and a high-frequency bias power for implanting ions into the wafer W to the support structure 18. In one embodiment, the bias power supply part 22 includes a first power source 22a and a second power source 22b. The first power source 22a generates a pulse-modulated DC voltage (hereinafter referred to as "modulated DC voltage") as a bias voltage to be applied to the support structure 18. The modulated DC voltage is a voltage in which a high-level period and a low-level period are alternately repeated. The modulated DC voltage may be set to a voltage value falling within a range of, for example, 0V to 1,200V. The frequency for pulse modulation may be set arbitrarily. The frequency for pulse modulation is a frequency capable of forming a sheath that enables acceleration of ions, and is, for example, 400 kHz. The on-duty ratio is a ratio falling within a range of 10% to 90%.

The second power source 22b is configured to supply high-frequency bias power for implanting ions into the wafer W to the support structure 18. The frequency of the high-frequency bias power may be any frequency suitable for implanting ions into the wafer W, and is, for example, 400 kHz. In the plasma processing apparatus 10, the modulated DC voltage from the first power source 22a and the high-frequency bias power from the second power source 22b may be selectively supplied to the support structure 18. The selective supply of the modulated DC voltage and the high-frequency bias power may be controlled by the controller Cnt.

The controller Cnt is, for example, a computer including a processor, a memory part, an input device, a display device, and the like. In the memory part of the controller Cnt, a computer program for executing the method MT and various data used for executing the method MT are readably stored. The controller Cnt operates according to a program based on the input recipe and sends a control signal. Each part of the plasma processing apparatus 10 is controlled by the control signal sent from the controller Cnt. Each process of the method MT may be executed by operating each part of the plasma processing apparatus 10 under the control of the controller Cnt.

When performing the plasma processing using the plasma processing apparatus 10, the gas from the gas source selected from the plurality of gas sources of the gas supply system 14 is supplied to the space S. Further, the space S is depressurized by the exhaust system 20. Then, the gas supplied to the space S is excited by a high-frequency electric field generated by the high-frequency power outputted from the high-frequency power source 150A and the high-frequency power source 150B. As a result, plasma is generated in the space S. Furthermore, the high-frequency bias power is supplied to the support structure 18. As a result, the ions in the plasma are accelerated toward the wafer W. The wafer W is etched by irradiating the workpiece with the ions and/or radicals thus accelerated.

Hereinafter, the method MT will be described in detail with reference to FIG. 1 again. An example in which the wafer W shown in FIG. 2 is etched using the plasma processing apparatus 10 shown in FIG. 3 will be described here. As shown in FIG. 1, the method MT includes a preparation step S10 and an etching step S12.

In the preparation step S10, the controller Cnt prepares the wafer W. The controller Cnt arranges the wafer W inside the processing container 12 of the plasma processing apparatus 10, i.e., in the space S. In the space S, the wafer W is placed on the support structure 18.

In the etching step S12, the controller Cnt uses the mask MK to etch the metal multilayer film ML with plasma of the mixed gas of ethylene gas and oxygen gas. In the etching step S12, the ethylene gas and the oxygen gas are supplied to the space S from the gas supply system 14. The ethylene gas and the oxygen gas are supplied to the space S as a mixed gas. The ethylene gas is contained in the mixed gas in a ratio of 50% to 63% with respect to the total amount of the ethylene gas and the oxygen gas.

The internal pressure of the space S is set to a designated pressure by the exhaust device 50. The high-frequency power is supplied from the high-frequency power source 150A and the high-frequency power source 150B to generate plasma. In the space S, the mixed gas of ethylene gas and oxygen gas is excited by the high-frequency electric field based on the high-frequency power, whereby plasma of the mixed gas of ethylene gas and oxygen gas is generated. For implantation of ions, the high-frequency bias power is supplied from the bias power supply part 22 to the support structure 18. By supplying the high-frequency bias power to the support structure 18, the ions (hydrogen and oxygen ions) in the plasma are implanted into the wafer W and are irradiated on the wafer W. Thus, the metal multilayer film ML is etched in the portion exposed from the mask MK. As a result, the pattern of the mask MK is transferred onto the metal multilayer film ML.

Ions and/or radicals of hydrogen and oxygen contained in plasma of an alcoholic gas such as methanol or the like affect plasma etching of the metal multilayer film ML including the magnetic tunnel junction. For example, when the metal multilayer film ML is etched by the plasma of hydrogen gas, the electromagnetic characteristics of the metal multilayer film ML are deteriorated. Presumably, the reason for this deterioration is that ions and/or radicals of hydrogen modify the metal multilayer film ML. Further, when an etching gas does not contain oxygen, a selection ratio between the metal multilayer film ML and the mask MK formed of a non-organic material is not sufficiently obtained. In the method MT, the etching gas is a mixed gas of ethylene gas and oxygen gas. The ethylene gas has a lower hydrogen content than a methanol gas. Therefore, according to the method MT, it is possible to suppress deterioration of the electromagnetic characteristics of the metal multilayer film ML including the magnetic tunnel junction, as compared with a case where an alcoholic gas is used as the etching gas. Moreover, according to the method MT, the etching gas contains oxygen. Therefore, it is possible to obtain a sufficient selection ratio between the metal multilayer film ML and the mask MK formed of a non-organic material.

According to the method MT, the ethylene gas is contained in the mixed gas in the ratio of 50% to 63% with respect to the total amount of the ethylene gas and the oxygen gas. Therefore, the metal multilayer film ML including the magnetic tunnel junction can be etched without generating an etching stop.

Methanol is in a liquid state at room temperature. Accordingly, in order to supply a methanol gas to the space S, it is necessary to vaporize methanol. That is, in order to supply the methanol gas, it is required to adopt incidental systems equipped with a manufacturing apparatus such as a liquid forcibly-feeding facility, an alcohol vaporizer, a heater pipe, and the like. On the other hand, the ethylene gas and the oxygen gas are in a gaseous state at room temperature. Accordingly, the ethylene gas and the oxygen gas may be supplied to the space S like general-purpose gases. For that reason, when the ethylene gas and the oxygen gas are used, the equipment can be simplified as compared with the case where the methanol gas is used. Accordingly, the method MT can reduce the operating cost while minimizing the equipment investment.

The contents of the present disclosure are not limited to the above-described embodiment, and various modifications may be adopted. For example, the method MT may be performed using any type of plasma processing apparatus such as a capacitively-coupled plasma processing apparatus or the like.

Hereinafter, various experiments performed for evaluating the method MT will be described. The present disclosure is not limited to the following experiments.

In order to compare the electro-magnetic characteristics of an MTJ element to which the method MT is applied and the electro-magnetic characteristics of an MTJ element to which a method of each of Comparative Examples is applied, evaluation samples were prepared under the following etching conditions.

Example 1

Etching target: metal multilayer film ML (see FIG. 2)
Etching gas: ethylene ($C_2H_4$), oxygen ($O_2$)
Gas flow rate: $C_2H_4$: 25 sccm, $O_2$: 25 sccm
Pressure in space S: 0.4 Pa (3 mTorr)
High frequency for plasma generation: 27 MHz, 1,400 W
High-frequency bias power: 400 kHz, 500 W
Tilt angle of support structure 18: 30 degrees
Substrate temperature: 65 degrees C.
Processing time: 650 seconds Comparative Example 1

Etching gas: methanol ($CH_3OH$)
Gas flow rate: 110 sccm
Other conditions are the same as in Example 1.

Comparative Example 2

Etching gas: ethylene ($C_2H_4$), oxygen ($O_2$), hydrogen ($H_2$) Gas flow rate: $C_2H_4$: 25 sccm, $O_2$: 25 sccm, $H_2$: 50 sccm Other conditions are the same as in Example 1.

Comparative Example 3

Etching gas: carbon monoxide (CO)
Gas flow rate: CO:100 sccm
High-frequency bias power: 400 kHz, 450 W
Processing time: 1,000 seconds
Other conditions are the same as in Example 1.

A pillar-shaped metal multilayer film ML to which the shape of the mask MK is transferred by etching was obtained. In each of Example 1, Comparative Example 1, Comparative Example 2, and Comparative Example 3, eight evaluation samples were prepared by changing the area of the mask MK. That is, eight evaluation samples having different MTJ element sizes were prepared under each etching condition.

(Evaluation of MTJ Element Size)

A resistance value RA ($\Omega\mu m^2$) per unit area of the flat metal multilayer film ML before etching was measured by a CIPT (Current In-Plane Tunneling) method. Subsequently, resistance measurement was performed with respect to the metal multilayer film ML etched in the pillar shape, while sweeping the magnetic field H (Oe) in the positive and negative ranges. In the resistance measurement, a resistance value R ($\Omega$) was measured by applying a voltage in the stacking direction of the metal multilayer film ML and detecting a current flowing in the stacking direction. Thus, an R-H curve indicating a relationship between the magnetic field and the resistance value was obtained. A resistance value RN was obtained based on the R-H curve. The resistance value $R_{MIN}$ is the smallest resistance value among the resistance values measured during the magnetization reversal of a magnetization free layer. Generally, the resistance value $R_{MIN}$ is a resistance value available when the direction of the magnetization free layer and the magnetization direction of the magnetization fixed layer are the same. Assuming that the cross section of the pillar-shaped metal multilayer film ML is circular, the diameter ED (nm) of the cross section can be derived from Equation 1 as follows:

$$(ED/2)^2 = RA/R_{MIN} \times 1/\pi \times 10^6 \quad (1)$$

where, since the diameter ED is a diameter evaluated by using an electric resistance, it is also referred to as an electrical diameter. The electrical diameters of all the evaluation samples of Example 1, Comparative Example 1, Comparative Example 2, and Comparative Example 3 were measured.

(Electromagnetic Resistance Ratio)

The electromagnetic resistance ratio (MR ratio) was calculated by the following equation 2 based on the R-H curve described above:

$$MR(\%) = (R_{MAX} - R_{MIN}) \times 100/R_{MIN} \quad (2)$$

where $R_{MAX}$ is the largest resistance value among the resistance values measured during the magnetization reversal of the magnetization free layer. Generally, the resistance value $R_{MAX}$ is a resistance value available when the direction of the magnetization free layer and the magnetization direction of the magnetization fixed layer are opposite to each other. The larger the MR ratio, the better the electromagnetic characteristics of the metal multilayer film ML.

(Coercive Force)

The coercive force Hc was calculated based on the R-H curve described above. Specifically, the coercive force Hc was calculated using the following equation (3):

$$Hc(Oe) = ||H_A| - |H_B||/2 \quad (3)$$

where $|H_A|$ is the absolute value of the magnetic field at which the resistance value is switched from $R_{MIN}$ to $R_{MAX}$ and $|H_B|$ is the absolute value of the magnetic field at which the resistance value is switched from $R_{MAX}$ to $R_{MIN}$. The larger the coercive force, the better the electromagnetic characteristics of the metal multilayer film ML.

(Evaluation Result of Electromagnetic Resistance Ratio)

Figure 6:
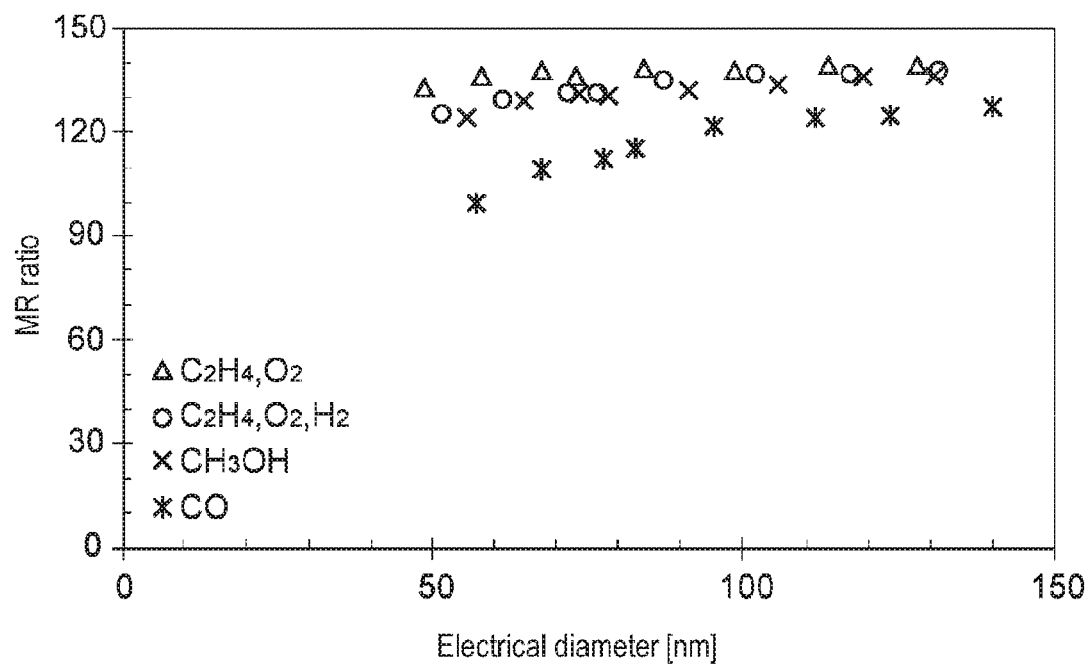
FIG. 6 is a graph showing a relationship between the electrical diameter and the MR ratio in an Example and Comparative Examples.

FIG. 6 is a graph showing a relationship between the electrical diameter and the MR ratio in Example and Comparative Examples. The horizontal axis indicates the electrical diameter, and the vertical axis indicates the MR ratio. The symbol "Δ" indicates Example 1 ($C_2H_4$, $O_2$), the symbol "x" indicates Comparative Example 1 (CH₃OH), the symbol "○" indicates Comparative Example 2 (C₂H₄, O₂, H₂), and the symbol "*" indicates Comparative Example 3 (CO). As shown in FIG. 6, in the evaluation sample of Comparative Example 1 (CH₃OH), the MR ratio decreases as the element size becomes smaller. That is, it was confirmed that when the MTJ element is miniaturized, a sufficient MR ratio may not be obtained in the plasma etching using the methanol gas. On the other hand, in the evaluation sample of Example 1 (C₂H₄, O₂), the MR ratio is almost constant even when the size of the MTJ element becomes smaller. From this result, it was confirmed that the plasma etching using the mixed gas of ethylene and oxygen can suppress the decrease in the MR ratio of the MTJ element as compared with the plasma etching using the methanol gas. This result suggests that the plasma etching using the mixed gas of ethylene and oxygen causes less damage to the MTJ element as compared with the plasma etching using the methanol gas.

The hydrogen content in the etching gas in Comparative Example 2 (C₂H₄, O₂, H₂) is the same as that in Comparative Example 1 (CH₃OH). The evaluation sample of Comparative Example 2 (C₂H₄, O₂, H₂) is almost the same as that of Comparative Example 1 (CH₃OH), and the electromagnetic characteristics thereof deteriorates as the size of the element becomes smaller. Example 1 (C₂H₄, O₂) has a lower hydrogen content than Comparative Example 1 (CH₃OH). From this result, it was confirmed that the decrease in the MR ratio can be suppressed by reducing the hydrogen content in the etching gas. In Comparative Example 3 (CO), the decrease in MR ratio is more remarkable than that in Comparative Example 1 (CH₃OH). From this, it was confirmed that the etching gas needs to contain hydrogen.

(Coercive Force Evaluation Result)

Figure 7:
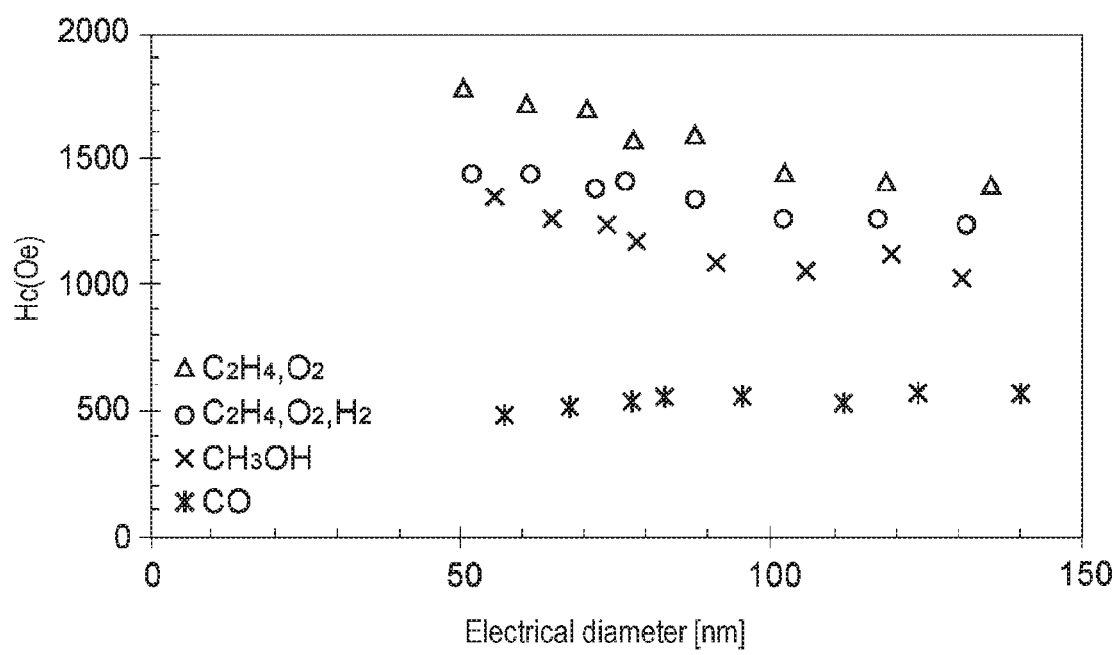
FIG. 7 is a graph showing a relationship between the electric diameter and the coercive force in an Example and Comparative Examples.

FIG. 7 is a graph showing a relationship between the electric diameter and the coercive force in Example and Comparative Examples. The horizontal axis indicates the electrical diameter, and the vertical axis indicates the coercive force. The symbol "Δ" indicates Example 1 (C₂H₄, O₂), the symbol "x" indicates Comparative Example 1 (CH₃OH), the symbol "○" indicates Comparative Example 2 (C₂H₄, O₂, H₂), and the symbol "*" indicates Comparative Example 3 (CO). As shown in FIG. 7, the measurement results show the same tendency as the MR ratio. It was confirmed that the evaluation sample of Example 1 (C₂H₄, O₂) has a larger coercive force than those of Comparative Examples 1 to 3. From this result, it was confirmed that the plasma etching using the mixed gas of ethylene and oxygen can suppress the decrease in the coercive force of the MTJ element as compared with the plasma etching using the methanol gas. This result suggests that the plasma etching using the mixed gas of ethylene and oxygen causes less damage to the MTJ element as compared with the plasma etching using the methanol gas.

As described above, from the results of FIGS. 6 and 7, it was confirmed that the deterioration of the electromagnetic characteristics (the MR ratio and the coercive force) of the metal multilayer film ML including the magnetic tunnel junction can be suppressed by the plasma of the mixed gas of ethylene and oxygen.

(Mixing Ratio of Ethylene and Oxygen)

MTJ elements were formed by changing the flow rate ratio of ethylene to oxygen. The flow rate ratio and the mixing ratio of ethylene are as follows. The mixing ratio of ethylene is a value obtained by dividing the flow rate of ethylene by the total sum of the flow rate of ethylene and the flow rate of oxygen and then multiplying the divided value by 100.

Condition 1: C₂H₄/O₂=50 sccm/0 sccm, ethylene mixture ratio 100%

Condition 2: C₂H/O₂=50 sccm/30 sccm, ethylene mixing ratio 63%

Condition 3: C₂H/O₂=50 sccm/50 sccm, ethylene mixture ratio 500%

Condition 4: C₂H₄/O₂=50 sccm/60 sccm, ethylene mixing ratio 45%

The etching amounts were confirmed using SEM images of the MTJ elements, and the feasibility of etching was evaluated. The results are shown in FIG. 8.

FIG. 8 is a table showing a relationship between the flow rate ratio of ethylene to oxygen and the etching feasibility. As shown in FIG. 8, in the case of condition 1, i.e., in the case of plasma etching performed using only an ethylene gas containing no oxygen, the deposition of a reaction product was more dominant than the etching, and the etching stop occurred. Thus, the determination of etching feasibility is indicated by the symbol "x" which indicates that etching is not feasible. It is considered that the result of condition 1 is due to the high content ratio of carbon.

In conditions 2 and 3, the target etching amount was achieved. It was confirmed that sufficient etching is feasible. Thus, the determination of etching feasibility is indicated by the symbol "○" which indicates that the etching is feasible. In condition 4, the etching amount did not reach the target etching amount. It could not be said that the etching is sufficiently performed. Thus, the determination of etching feasibility is indicated by the symbol "Δ" which indicates that the etching is somewhat infeasible.

As shown in FIG. 8, it was confirmed that, by setting the mixing ratio of ethylene to fall in the ranges of condition 2 and condition 3, i.e., in the range of 50% to 63%, the metal multilayer film ML including the magnetic tunnel junction can be etched without generating an etching stop.

EXPLANATION OF REFERENCE NUMERALS

10: plasma processing apparatus, 12: processing container, 14: gas supply system, 16: plasma source, 18: support structure, 20: exhaust system, 22: bias power supply part, S: space, W: wafer, ML: metal multilayer film, MK: mask

What is claimed is:

1. An etching method, comprising:
preparing a workpiece including a metal multilayer film having a magnetic tunnel junction and a mask formed by an inorganic material on the metal multilayer film in a space within a processing container;
supplying an ethylene gas and an oxygen gas to form a mixed gas of ethylene gas and oxygen gas in the space;
generating a plasma of the mixed gas in the space by exciting the mixed gas; and
etching the metal multilayer film by the plasma of the mixed gas of ethylene gas and oxygen gas using the mask,
wherein the ethylene gas is included in the mixed gas in a ratio of 50% to 63% with respect to the total amount of the ethylene gas and the oxygen gas, and
wherein a flow rate ratio of the ethylene gas to a total flow rate of the ethylene gas and the oxygen gas ranges from 50% to 63%.

2. An etching method, comprising:
preparing a workpiece including a metal multilayer film having a magnetic tunnel junction and a mask formed by an inorganic material on the metal multilayer film; and
etching the metal multilayer film by a plasma of a mixed gas of ethylene gas and oxygen gas using the mask,
wherein the ethylene gas is included in the mixed gas in a ratio of 50% to 63% with respect to the total amount of the ethylene gas and the oxygen gas, and
wherein a flow rate ratio of the ethylene gas to a total flow rate of the ethylene gas and the oxygen gas ranges from 50% to 63%.

3. The etching method of claim 1, wherein the metal multilayer film includes a plurality of layers that form the magnetic tunnel junction, and
wherein an uppermost layer of the plurality of layers has a stacked structure formed of a plurality of magnetic layers and nonmagnetic layers.

4. The etching method of claim 1, wherein the metal multilayer film includes an upper electrode made of Ta or Ru.

5. The etching method of claim 1, wherein the etching the metal multilayer film is performed using a capacitively-coupled plasma processing apparatus.

6. The etching method of claim 2 wherein the metal multilayer film includes a plurality of layers that form the magnetic tunnel junction, and
wherein an uppermost layer of the plurality of layers has a stacked structure formed of a plurality of magnetic layers and nonmagnetic layers.

7. The etching method of claim 2, wherein the metal multilayer film includes an upper electrode made of Ta or Ru.

8. The etching method of claim 2, wherein the etching the metal multilayer film is performed using a capacitively-coupled plasma processing apparatus.

* * * * *